United States Patent [19]

Nakamura et al.

[11] Patent Number: 5,739,565
[45] Date of Patent: Apr. 14, 1998

[54] SEMICONDUCTOR DEVICE AND MANUFACTURING PROCESS THEREFOR

[75] Inventors: Yoshio Nakamura, Atsugi; Mamoru Miyawaki, Isehara; Isamu Ueno, Hadano, all of Japan

[73] Assignee: Canon Kabushiki Kaisha, Tokyo, Japan

[21] Appl. No.: 365,318

[22] Filed: Dec. 28, 1994

Related U.S. Application Data

[63] Continuation of Ser. No. 984,550, Dec. 2, 1992, abandoned.

[30] Foreign Application Priority Data

Dec. 2, 1991 [JP] Japan ................................. 3-341762

[51] Int. Cl.$^6$ ............... H01L 27/108; H01L 29/76; H01L 29/94; H01L 31/119
[52] U.S. Cl. ................... 257/301; 257/309; 257/534
[58] Field of Search .................... 257/753, 739, 257/621, 622, 626, 599, 600, 606, 520, 532, 301, 309, 534

[56] References Cited

U.S. PATENT DOCUMENTS

| | | |
|---|---|---|
| 4,144,636 | 3/1979 | Burkhardt et al. .............. 437/215 |
| 4,510,016 | 4/1985 | Chi et al. ......................... 437/69 |
| 4,800,527 | 1/1989 | Ozaki et al. . |
| 5,023,200 | 6/1991 | Blewer et al. .................... 437/61 |
| 5,138,411 | 8/1992 | Sandu .............................. 257/309 |
| 5,156,896 | 10/1992 | Katoh et al. ...................... 437/69 |
| 5,278,437 | 1/1994 | Wakamiya et al. .............. 257/534 |

FOREIGN PATENT DOCUMENTS 2-6558  1/1990  Japan.

OTHER PUBLICATIONS

Appl. Phys. Let. vol. 24, No. 4, Feb. 1983, pp. 386–388, Holmstorm et al., "Complete dielectric isolation by highly selective and self–stopping formation of oxidized porous silicon."

J. Electrochem. Soc., vol. 127, No. 2, Feb. 1980, pp. 476–483, Unagami, "Formation Mechanism of Porous Silicon Layer etc" Bell Tech. J., vol. 35, 1956, pp. 333–347, Uhlir, Jr. Electrolytic Shaping of Germanium and Silicon.

*Primary Examiner*—Mahshid D. Saadat
*Assistant Examiner*—S. V. Clark
*Attorney, Agent, or Firm*—Fitzpatrick, Cella, Harper & Scinto

[57] ABSTRACT

A semiconductor device with holes of porous texture in a part of the surface of a semiconductor substrate. The holes are filled with a conductive material across an insulating layer.

2 Claims, 7 Drawing Sheets

SEMICONDUCTOR DEVICE AND MANUFACTURING PROCESS THEREFOR

This application is a continuation of application Ser. No. 07/984,550 filed Dec. 2, 1992, now abandoned.

BACKGROUND OF THE INVENTION

1. Field of the Invention

The present invention relates to a semiconductor device and a manufacturing process therefor, and more particularly to a semiconductor device in which a capacitance is formed by a hole formed in a semiconductor substrate, and a manufacturing process therefor.

2. Related Background Art

Conventionally technologies for forming a compact capacitor of large capacitance in a semiconductor device are utilized not only in DRAM but also in various devices. Among these technologies, particularly active developments have been made on a trench capacitor, stacked capacitor, and, more recently, the technology for forming capacitance utilizing surface irregularities of polycrystalline silicon.

Such conventional technologies are detailedly described in the U.S. Pat. No. 4,800,527 entitled "Semiconductor Memory Device" and awarded to the inventors Osaki et al.

However the reduction in geometry of the semiconductor devices is still progressing, and a capacitance device of a larger capacitance and a small area is therefore longed for.

SUMMARY OF THE INVENTION

The semiconductor device of the present invention is featured by the fact that holes of porous texture are formed in a part of the surface of a semiconductor substrate and are filled with a conductive material across an insulating layer.

Also the manufacturing process for the semiconductor device of the present invention is featured by a step of forming a porous texture through a part of the surface of the semiconductor substrate thereby forming gaps in said semiconductor substrate, a step of applying an oxidizing treatment from said gaps and eliminating thus oxidized areas thereby forming holes of porous texture, and a step of applying an insulating treatment to the surface of said semiconductor substrate and filling said holes, on the insulating film formed on the wall of said holes, with a conductive material.

The aforementioned trench capacitance is obtained by forming a vertically oblong hole in the semiconductor substrate and filling said hole for example with a polysilicon electrode across an insulating layer. On the other hand, the semiconductor device of the present invention is to obtain a capacitance of a large electrode area by forming a hole of porous texture in a part of the surface of the semiconductor substrate thereby increasing the surface area of the hole, and by filling said hole of porous texture with a conductive material across an insulating layer.

Such hole of porous texture can be obtained by the following porosifying treatments for semiconductive materials.

The porosifying treatment of semiconductor was discovered by Uhlir et al. in 1956, in the course of research of electrolytic polishing of semiconductors (A. Uhlir, Bell Syst. Tech. J., vol. 35, 333(1956)). Also Unagami et al. investigated the dissolution of Si in anodizing and reported that the anodic reaction of Si in HF solution required positive holes and followed following equations (T. Unagami: J. Electrochem. Soc., vol. 127, 476(1980)):

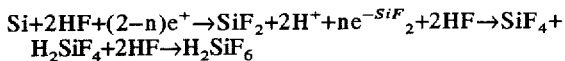

or

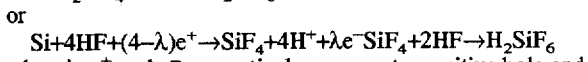

wherein $e^+$ and $e^-$ respectively represent a positive hole and an electron, and n and $\lambda$ represent the number of positive holes required for dissolution of an Si atom. It was reported that porous Si was formed when a condition $n>2$ or $\lambda>4$ was satisfied.

As mentioned above, positive holes are required for forming porous Si, and P-type Si is more easily transformed into porous Si than N-type Si. However, N-type Si is also known to be transformable into porous Si by the injection of positive holes (R. P. Holmstrom and J. Y. Chi, Appl. Phys. Lwtt. vol. 42, 386(1983)).

In contrast to the density 2.33 g/cm$^3$ of monocrystalline Si, the density of porous Si layer can be varied within a range of 1.1 to 0.6 g/cm$^3$ by a variation of concentration of HF solution within a range of 50 to 20%. The porous Si layer contains holes of a diameter of about 600 Å in average, according to the observation under a transmissive electron microscope.

The porosifying process of semiconductor proceeds at first with the formation of ramified or ramiform gaps from a semiconductor surface at the cathode side in contact with the HF solution, then with the extension of said gaps along the direction of electric field with formation of new ramified gaps, with eventual formation of porous texture in the entire semiconductor layer.

The manufacturing process for the semiconductor device of the present invention consists, in the formation of holes of porous texture, of forming ramified gaps of a desired size in the semiconductor substrate from a part of the surface thereof by means of the above-mentioned porosifying treatment, then applying an oxidizing treatment from said gaps, then eliminating thus formed oxidized areas thereby obtaining thicker ramified gaps (holes of porous texture) with a larger surface area, then forming an insulating film in said holes and depositing a conductive material on said insulating film, thereby obtaining a capacitance with an increased surface area.

In the above-mentioned manufacturing process, it is rendered possible to selectively deposit aluminum in the holes, without deposition on the upper face of the semiconductor substrate, by applying an insulating treatment to the surface of the semiconductor substrate, modifying the insulating film, formed on the wall of said holes, into an electron donating surface, and depositing conductive material selectively in said holes by means of CVD employing alkyl aluminum hydride diluted with hydrogen.

DETAILED DESCRIPTION OF THE PREFERRED EMBODIMENTS

Now the present invention will be clarified in details by preferred embodiments thereof shown in the attached drawings.

[Embodiment 1]

FIGS. 1A to 1E are views showing the steps of the manufacturing process for a semiconductor device constituting a first embodiment of the present invention.

Figure 1A:
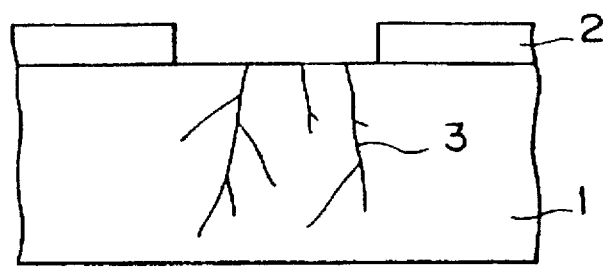
FIGS. 1A to 1E are views showing steps of the manufacturing process for a semiconductor device, constituting a first embodiment of the present invention.

At first, as shown in FIG. 1A, photoresist 2 is coated on the entire surface of a semiconductor wafer 1 of a thickness of 500 μm, and an area for constituting the electrode of the capacitance to be formed is patterned.

Then the semiconductor wafer 1 is subjected to an anodizing process to form ramified gaps 3 in a porosifying process.

Figure 2:
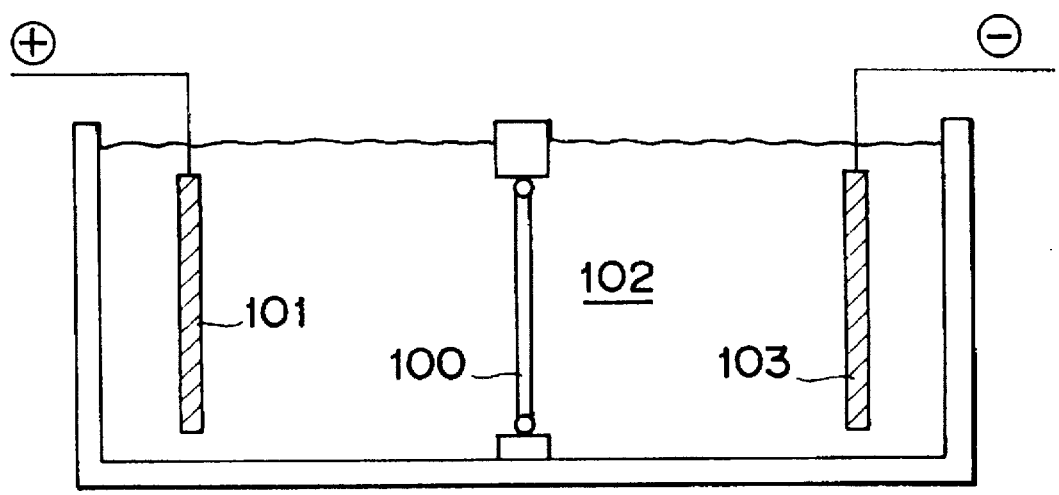
FIG. 2 is a schematic view of an apparatus for porosifying the semiconductor wafer.

Reference is now made to FIG. 2, for explaining an apparatus for formation of porous texture in the semiconductor wafer 1. There is prepared a P-type monocrystalline silicon substrate 100 (corresponding to the semiconductor wafer 1). There may also be employed an N-type substrate in certain cases, as explained before. The substrate 100 is set in an apparatus shown in FIG. 2, wherein the substrate 100 is maintained in contact with solution 102 of hydrofluoric acid, and a cathode 103 and an anode 101 are provided in respective sides of the substrate 100. The formation of porous texture takes place from the side of cathode of the substrate 100 maintained in contact with the hydrofluoric acid solution.

The hydrofluoric acid solution 102 generally consists of concentrated hydrofluoric acid (49% HF). Dilution with pure water (H$_2$O) is not desirable because etching occurs from a certain concentration, depending on the magnitude of current. An alcohol may be added as surfactant, for efficiently removing the bubbles generated from the surface of the substrate 100 in the course of anodizing. Said alcohol can be, for example, methanol, ethanol, propanol or isopropanol. Instead of adding surfactant, the anodizing may be conducted under agitation with a stirrer. The electrodes 101, 103 are composed of a material resistant to the hydrofluoric acid, such as gold (Au) or platinum (Pt). The current for anodizing can be several hundred mA/cm$^2$ at maximum and a non-zero value at minimum, but is suitably selected according to the desired magnitude of capacitance to be formed, as said current affects the length and shape of the ramified gaps.

The porosifying treatment of the semiconductor wafer 1 was conducted by the apparatus explained above, with a current density of 100 mA/cm$^2$, and ramified gaps 3 of a depth of ca. 8 μm were formed in one minute. Thereafter the photoresist 2 is removed, and the surface is rinsed for example with pure water.

Figure 1B:
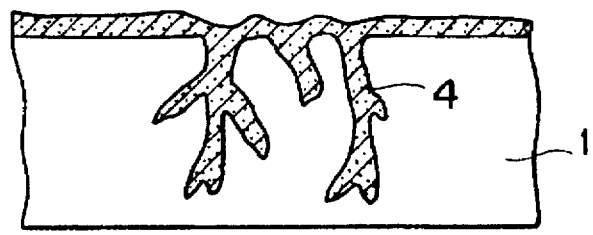

Then wet oxidation is conducted at 900° C. whereby oxidation of Si proceeds from the above-mentioned ramified gaps 3, to form thick ramified SiO$_2$ area 4, as shown in FIG. 1B.

Figure 1C:
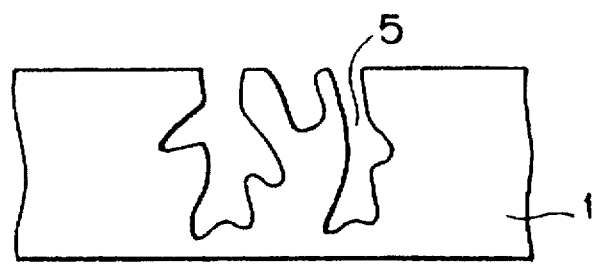

Subsequently said SiO$_2$ area 4 is etched off for example with diluted hydrofluoric acid (for example pure water:hydrofluoric acid=20:1), and, after the etching, said etchant is rinsed off with pure water from the broadened gaps, whereby holes 5 of porous texture are obtained as shown in FIG. 1C. The magnitude of said holes 5 is so selected as to enable deposition of a conductive material therein. If the holes of a desired magnitude cannot be obtained by a wet oxidation and an etching, these steps may be repeated plural times. Also such repeated steps are effective for precise control of the magnitude of the holes of porous texture.

Figure 1D:
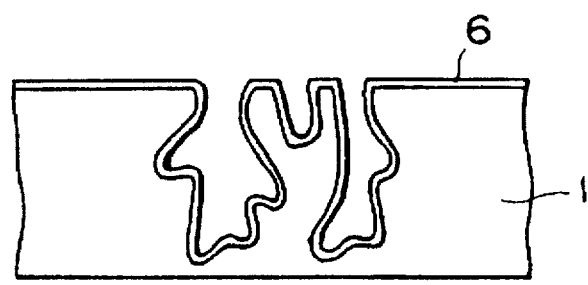
Figure 1E:
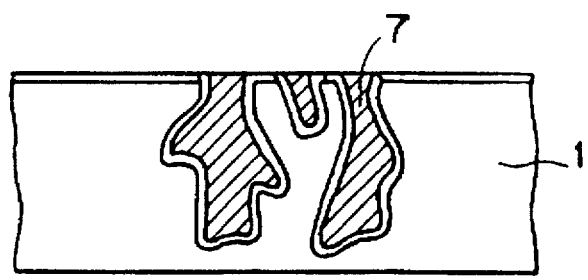

Then dry oxidation is conducted for 30 minutes at 1000° C. to form a thin oxide film 6 on the surface of the substrate as shown in FIG. 1D, and the holes 5 of porous texture are filled with a conductive material 7 such as aluminum as shown in FIG. 1E. There may also be employed, as said conductive material, poly-Si employed in the trench capacitor, or tungsten. Also there may be employed other materials, as long as they are conductive, show a large migration and are easy to fill the holes. The Al-CVD method is an example of technologies for filling the holes 5 of porous texture with the conductive material.

The Al-CVD method is conducted under a pressure of 10$^{-3}$ to 760 Torr with a substrate temperature of 60° to 450° C., employing alkyl aluminum hydride diluted with H$_2$ gas, as detailedly disclosed in the Japanese Patent Laid-open Application No. 2-6558, and is capable of selectively depositing aluminum on an electron donating surface. This method will be explained in the following in more details.

The electron donating material means a material in which free electrons are present or intentionally generated, and which has a surface capable of accelerating chemical reaction by electron exchange with the molecules of raw material gas deposited on the material surface. Ordinary metals and semiconductors fall into this category.

More specifically, the electron donating materials include semiconductors such as monocrystalline, polycrystalline or amorphous silicon; binary, ternary or quaternary III–V compound semiconductors obtained by combining an element or elements of the group III of the periodic table such as Ga, In and/or Al and an element or elements of the group V such as P, As and/or N; and metals, alloys thereof and silicides thereof such as tungsten, molybdenum, tantalum, tungsten silicide, titanium silicide, aluminum, aluminum-silicon, titanium-aluminum, titanium nitride, copper, aluminum-silicon-copper, aluminum-paradium, titanium, molybdenum silicide or tantalum silicide.

Examples of alkyl aluminum hydride include dimethylaluminum hydride (DMAH: (CH$_3$)$_2$AlH) and monomethylaluminum hydride (MMAH: CH$_3$AlH$_2$).

On the substrate of the above-mentioned composition, aluminum deposits by a simple thermal reaction only in a reaction system composed of raw material gas and H$_2$. For example, the thermal reaction in the reaction system consisting of (CH$_3$)$_2$AlH (DMAH) and H$_2$ can be basically considered as:

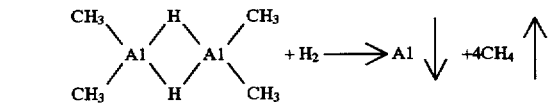

DMAH has a dimer structure at the room temperature.

On the materials not falling into the above-mentioned category, for example highly insulating materials such as SiO$_2$, Si$_3$N$_4$, SiC, BN, diamond, Al$_2$O$_3$ or TaO$_2$, the deposition does not take place by the low pressure CVD merely employing alkylaluminum hydride diluted with H$_2$.

If the surface for example of a semiconductor integrated circuit is covered with a layer of such electron non-donating material, it is possible to prevent Al deposition on such covered area. Consequently, by forming the Al electrode in this manner after the crystal growth for example with the SOI method, the Al electrode is not deposited on the $SiO_2$ areas between the devices but only on the device surfaces, so that the device separation can be automatically achieved.

However, even in the above-mentioned electron non-donating materials, the electron non-donating surface thereof may be rendered electron donating by surface modification. Said surface modification is to create, even on the electron non-donating surface, a state having free electrons and capable of contributing to the surface reaction. In case of $SiO_2$ as in the present embodiment, there may be employed a method of irradiation with light of an energy larger than the forbidden band width of $SiO_2$ thereby generating free electrons on the electron non-donating surface, a method of irradiation with a suitably accelerated electron beam thereby charging the surface with electrons or generating free electrons thereon, or a method of applying an ion beam or plasma thereby breaking, for example, Si—O bonds present on the surface and generating electrons by the uncoupled bonds.

In the present embodiment among the upper face of the substrate and the wall of the holes of porous texture which are rendered electron non-donating by the formation of the oxide film 6, the oxide film of the wall alone of the porous holes is changed to the electron donating surface by surface modification, and Al (or Al—Si) is deposited solely in said holes of porous texture.

More specifically, the $SiO_2$ surface is modified to electron donating by irradiation with an electron beam in the desired position, and a gaseous mixture of DMAH and $H_2$ (flow rate ratio 650:1) for Al deposition or a mixture of DMAH, $H_2$ and $Si_2H_6$ (flow rate ratio 150:1:0.5) for Al—Si deposition is supplied to the substrate heated at least to the decomposition temperature. In this manner Al or Al—Si was deposited solely in the holes of porous texture, which was completely filled after 60 minutes.

Through the above-explained steps, there is formed a large capacitance between the Si wafer and the metal electrode formed therein, since said holes of porous texture have an extremely large surface area.

[Embodiment 2]

In contrast to the foregoing first embodiment in which the ramified gaps are formed from the upper face of the semiconductor substrate, the present embodiment is featured by forming apertures in advance and growing ramified gaps from the surfaces (walls) of said apertures.

FIGS. 3A to 3D illustrate steps of the manufacturing process for a semiconductor device constituting a second embodiment of the present invention.

Figure 3A:
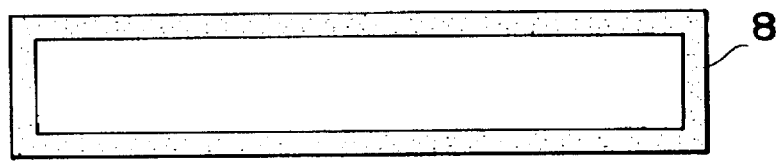
FIGS. 3A to 3D are views showing steps of the manufacturing process for a semiconductor device, constituting a second embodiment of the present invention.

At first, as shown in FIG. 3A, photoresist 8 is coated on the entire surface of the wafer.

Figure 3B:
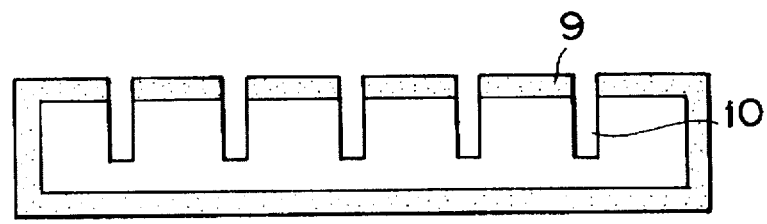

Then, as shown in FIG. 3B, the photoresist is patterned in areas constituting electrodes of the capacitance to be formed, and the Si substrate is etched utilizing the remaining photoresist 9 as a mask, thereby forming apertures 10.

Figure 3C:
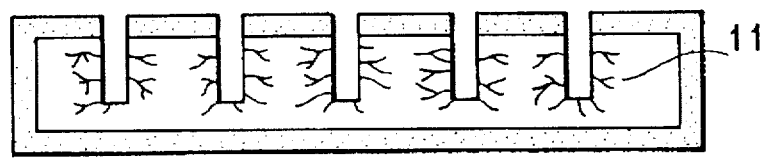
Figure 3D:
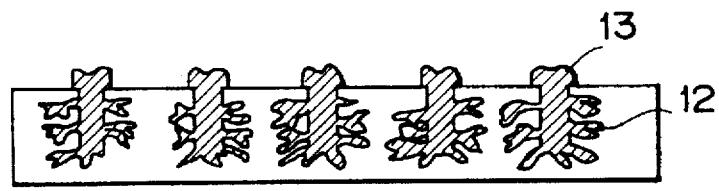

Then, as shown in FIG. 3C, ramified gaps 11 are formed from the surfaces of the apertures 10 of the Si substrate, by the anodizing in the same manner as in the embodiment 1. In this operation, said gaps extend in a direction parallel to the surfaces of the substrate, by positioning the substrate 100 perpendicularly to the electrodes 101, 103 shown in FIG. 2, thereby applying the electric field in a direction parallel to the surfaces of said substrate. The porous texture formation takes place from the cathode side of the substrate 100 in contact with the hydrofluoric acid solution. Therefore, for forming the ramified gaps 11 in both lateral directions of the apertures as shown in FIG. 3C, said gaps are at first formed in one direction, and then the substrate 100 is rotated by 180° for forming the gaps in the other direction.

Subsequently, after the removal of the photoresist, there are conducted the wet oxidation and the etching of $SiO_2$ to broaden said ramified gaps in the same manner as in the first embodiment, and, after dry oxidation, buried electrodes 13 are formed, as shown in FIG. 13D, in the porous holes 12 bearing an oxide film on the wall thereof. Said electrodes may be composed of a conductive material showing large migration and capable of easily filling the holes, such as Al, poly-Si or W, as in the first embodiment.

The above-explained steps allow to significantly increase the surface area of the capacitor, thereby providing a large capacitance.

[Embodiment 3]

The above-explained second embodiment allows to increase the surface area of the capacitance, but, in the deposition of metal in the gaps (holes of porous texture) windened by etching, it may be difficult to fill the holes to the end portions thereof since the ramified gaps are formed in a direction parallel to the surfaces of the wafer.

Figure 4:
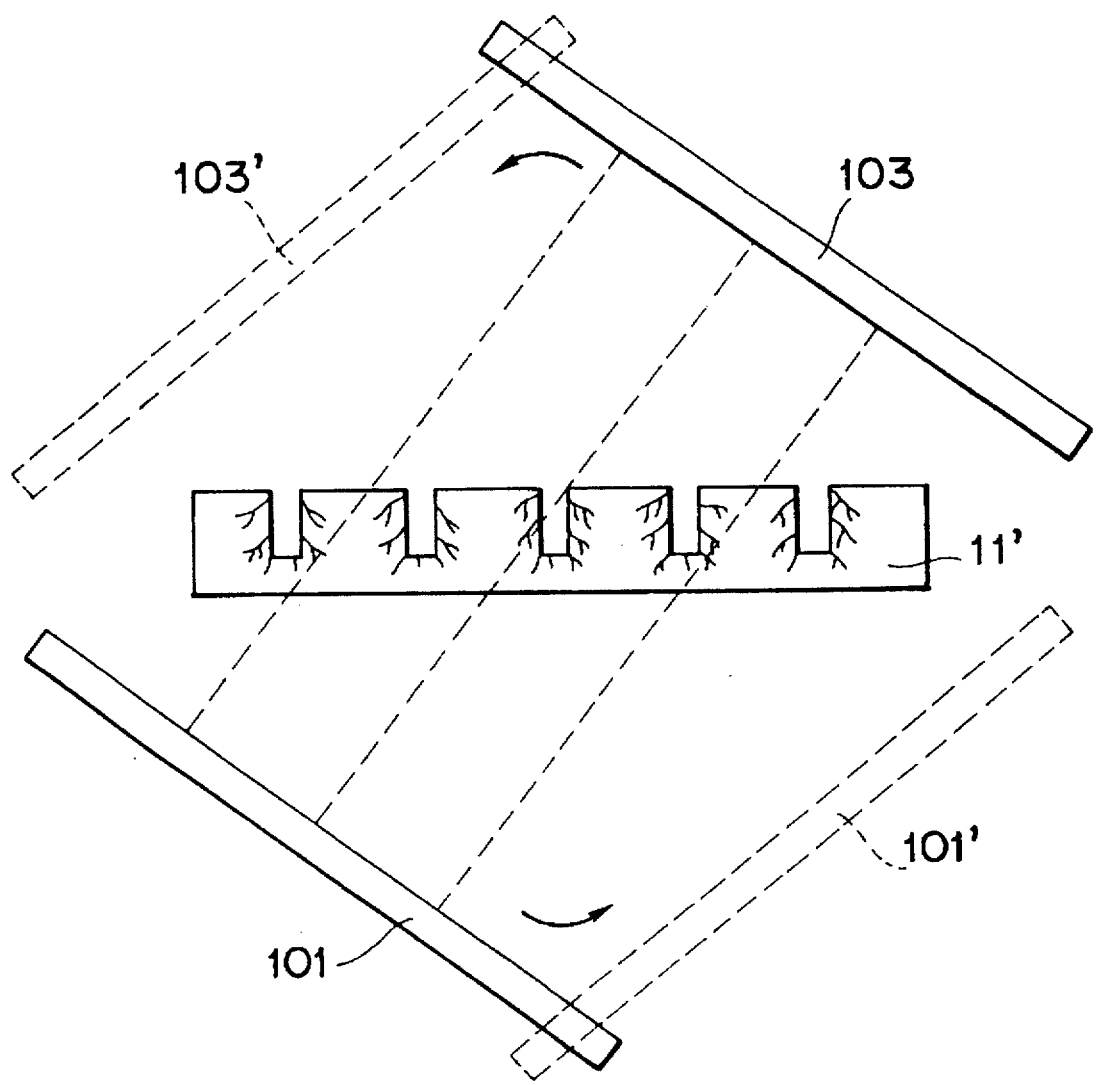
FIG. 4 is a schematic view showing the porosifying method, in the manufacturing process of a semiconductor device constituting a third embodiment of the present invention.

In the present embodiment, at the anodizing operation, the electrodes 101, 103 are so positioned, as shown in FIG. 4, as to apply the electric field in an oblique direction with respect to the surfaces of the semiconductor wafer, thereby forming ramified gaps in an oblique direction, and are then rotated with respect to the center of the wafer to positions 101', 103' for forming the ramified gaps in another oblique direction. Thus the ramified gaps 11' extend in oblique directions, substantially uniformly from all the lateral walls of the apertures. Thus, as the ramified gaps are inclined toward the rear face of the wafer, the filling of the gaps with the metal electrode is rendered easier than in the second embodiment.

[Embodiment 4]

The present embodiment constitutes the application of the present invention to the capacitor of the memory cell of a RAM. The present embodiment can provide a larger capacitance for a given cell size, in comparison with the conventional trench or stacked capacitor, because of the larger surface area of the capacitor.

Figure 5:
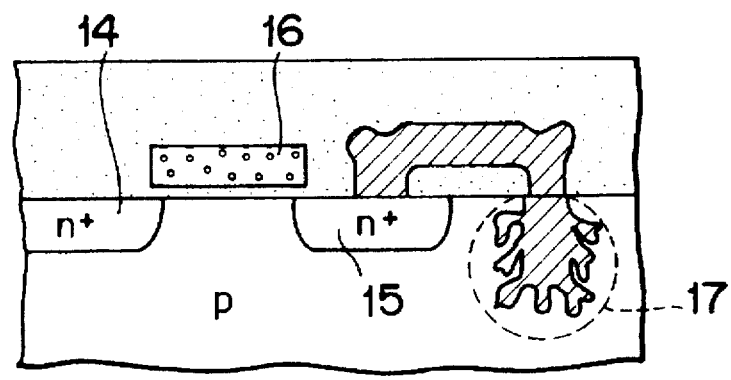
FIG. 5 is a cross-sectional view showing the configuration of a semiconductor device, constituting a fourth embodiment of the present invention.

FIG. 5 is a partial cross-sectional view of a memory cell of the RAM, wherein shown are a word line 16; an $n^+$ diffusion layer 14 connected to a bit line; a diffusion layer 15 connected to the capacitance, wherein said layers 14, 15 respectively constitute source and drain areas of a MOSFET; and a capacitance 17 formed by the technology of the third embodiment shown in FIG. 4.

[Embodiment 5]

Figure 6:
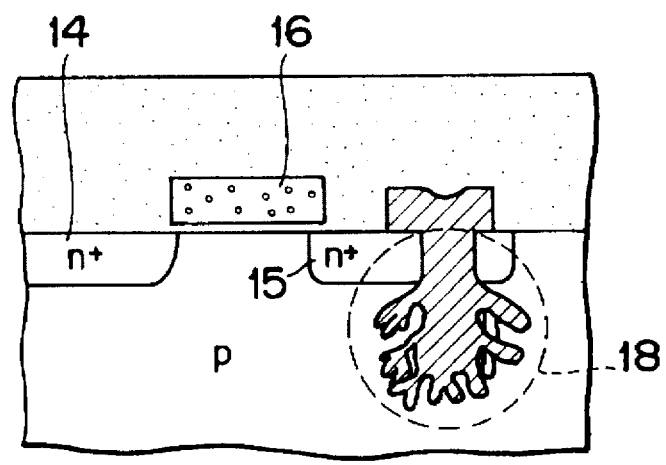
FIG. 6 is a cross-sectional view showing the configuration of a semiconductor device, constituting a fifth embodiment of the present invention.

The present embodiment also constitutes an application of the present invention to the capacitor of the memory cell of RAM, but, in the present embodiment, the accumulating capacitance is formed below the drain area, as shown in FIG. 6. Thus, in comparison with the fourth embodiment, the present embodiment can further reduce the cell size and is therefore advantageous for obtaining a larger capacitance.

In the following there will be explained, with reference to FIGS. 7A to 7C, the manufacturing process for the capacitor of the memory cell of the RAM of the present embodiment.

Figure 7A:
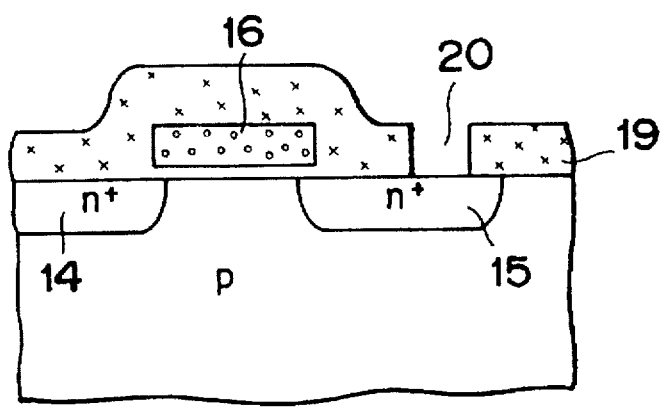
FIGS. 7A to 7C are views showing the steps of the manufacturing process for the semiconductor device of the fifth embodiment.

At first, an NMOS transistor is prepared by a known memory cell manufacturing process, as shown in FIG. 7A. Then photoresist 19 is coated over the entire surface of the wafer, and a hole 20 is opened on the drain area 15 of the NMOS transistor where the electrode of the accumulating capacitance for each cell is to be formed.

Figure 7B:
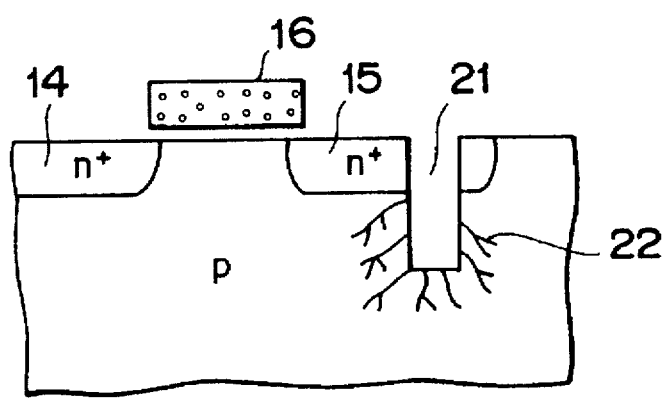

Then, as shown in FIG. 7B, Si is etched, utilizing said photoresist 19 as a mask, to form an aperture 21, and the anodizing is effected by the technology of the third embodiment to form ramified gaps 22.

Figure 7C:
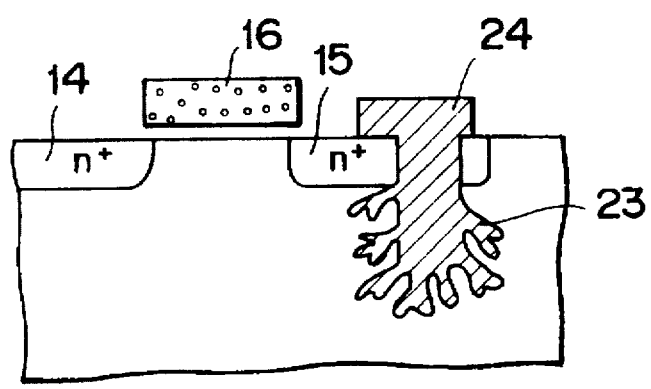

Subsequently, as shown in FIG. 7C, there are executed wet oxidation and SiO₂ to form holes 23 of porous texture, then the wall of said holes is oxidized by dry oxidation, and the holes are filled with the polycrystalline silicon 24.

Finally the polycrystalline silicon is patterned, leaving the bonding area, and an insulation film is formed on the wafer surface to obtain a RAM memory cell as shown in FIG. 6.

Figure 8:
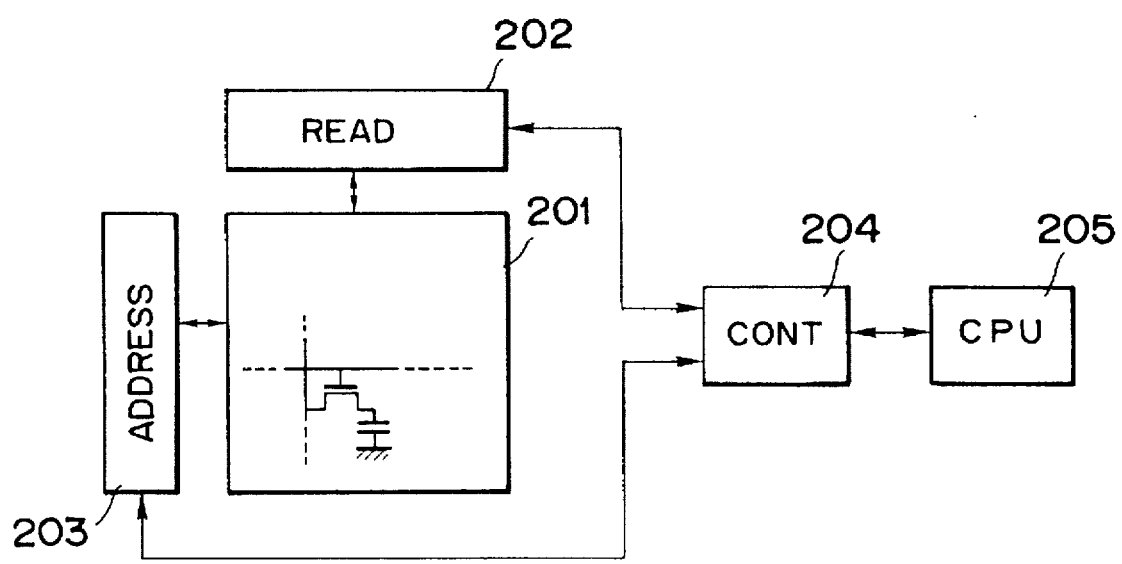
FIG. 8 is a block diagram of a signal processing system employing a memory device of the present invention.

FIG. 8 is a block diagram of a signal processing system, employing the semiconductor device of the present invention in a memory.

There is provided an array 201 of the memory devices of the present invention, wherein each column line is connected to a write-in and read-out circuit 202 including a drive circuit and a sensing amplifier, while each row line is connected to an address circuit 203 for turning on the MOS transistor of each memory device. Said array 201 and circuits 202, 203 are constructed as a one-chip integrated semiconductor circuit.

The information signals are stored (written) or read through a controller 204, under the control of a central processing unit 205.

As detailedly explained in the foregoing, the semiconductor device of the present invention is capable of increasing the surface area of the holes constituting the capacitance, thereby obtaining a capacitor of a larger capacitance and a smaller area in the semiconductor substrate.

Also the manufacturing process for the semiconductor device of the present invention allows to obtain a capacitor of a larger electrode area and a smaller occupying area, by forming ramified gaps of a desired size within a semiconductor substrate, from a part of the surface thereof, then applying oxidation to said gaps and eliminating thus oxidized area thereby forming thicker ramified gaps or holes of porous texture with an increased surface area, then forming an insulation film in said holes and depositing a conductive material into said holes.

In the above-mentioned manufacturing process, it is possible to deposit aluminum selectively in said holes without aluminum deposition on the upper face of the semiconductor substrate, by applying an insulating treatment on the surface of the semiconductor substrate, then effecting surface modification to the insulation film formed on the wall of said holes to obtain an electron donating surface, and selectively depositing aluminum in said holes by a CVD process employing alkyl aluminum hydride diluted with hydrogen.

What is claimed is:

1. A semiconductor device comprising:

a semiconductor substrate having a porous region within which is formed a ramiform gap having a ramiform surface;

a source region and a drain region formed in said substrate;

a gate electrode formed on a surface of said substrate;

an insulating film formed over said ramiform surface to leave an interior ramiform gap; and a conductive material filling said interior ramiform gap, wherein said porous region, insulating film and conductive material form a capacitor for storing charge, said conductive material being electrically connected to at least one of said source region and said drain region.

2. A semiconductor device according to claim 1, wherein said conductive material is disposed under said source and drain regions.

* * * * *

UNITED STATES PATENT AND TRADEMARK OFFICE
CERTIFICATE OF CORRECTION

PATENT NO. : 5,739,565
DATED : April 14, 1998
INVENTOR(S) : YOSHIO NAKAMURA ET AL.

It is certified that error appears in the above-identified patent and that said Letters Patent is hereby corrected as shown below:

ON THE TITLE PAGE AT ITEM [54]

"SEMICONDUCTOR DEVICE AND MANUFACTURING PROCESS THEREFOR" should read --SEMICONDUCTOR DEVICE INCORPORATING A CAPACITOR FORMED IN A RAMIFORM GAP--.

COLUMN 1

Lines 1-2, "SEMICONDUCTOR DEVICE AND MANUFACTURING PROCESS THEREFOR" should read --SEMICONDUCTOR DEVICE INCORPORATING A CAPACITOR FORMED IN A RAMIFORM GAP--.

UNITED STATES PATENT AND TRADEMARK OFFICE
CERTIFICATE OF CORRECTION

PATENT NO. : 5,739,565
DATED : April 14, 1998
INVENTOR(S) : YOSHIO NAKAMURA ET AL.

It is certified that error appears in the above-identified patent and that said Letters Patent is hereby corrected as shown below:

<u>COLUMN 2</u>

Lines 1-4 should read:

-- 
$$Si + 2HF + (2-n)e^+ \rightarrow SiF_2 + 2H^+ + ne^-$$
$$SiF_2 + 2HF \rightarrow SiF_4 + H_2$$
$$SiF_4 + 2HF \rightarrow H_2SiF_6$$

or $$Si + 4HF + (4-\lambda)e^+ \rightarrow SiF_4 + 4H^+ + \lambda e^-$$
$$SiF_4 + 2HF \rightarrow H_2SiF_6$$
--

Signed and Sealed this

Twenty-second Day of December, 1998

*Attest:*

BRUCE LEHMAN

*Attesting Officer*  *Commissioner of Patents and Trademarks*